United States Patent
Vongfuangfoo et al.

[11] Patent Number: 6,126,063
[45] Date of Patent: Oct. 3, 2000

[54] INTEGRATED CIRCUIT PACKAGING APPARATUS AND METHOD

[75] Inventors: Sutee Vongfuangfoo, Sunnyvale; Minh Vuong, San Jose; Brent R. Bacher, Los Alamitos, all of Calif.

[73] Assignee: LSI Logic Corporation, Milpitas, Calif.

[21] Appl. No.: 08/911,515

[22] Filed: Aug. 14, 1997

(Under 37 CFR 1.47)

[51] Int. Cl.[7] .................... B23K 1/00; B23K 3/06
[52] U.S. Cl. .................... 228/246; 228/41; 228/245
[58] Field of Search .................... 228/41, 246, 253, 228/245

[56] References Cited

U.S. PATENT DOCUMENTS

| | | | |
|---|---|---|---|
| 4,871,110 | 10/1989 | Fukasawa et al. | 228/41 |
| 5,655,704 | 8/1997 | Sakemi et al. | 228/246 |
| 5,758,409 | 6/1998 | Nakazato | 228/41 |
| 5,839,641 | 11/1998 | Teng | 228/246 |

*Primary Examiner*—Samuel M. Heinrich
*Assistant Examiner*—Jeffrey T. Knapp

[57] ABSTRACT

Apparatus and method for assembling solder balls in a selected one of several different patterns for delivery to connector pads on an integrated circuit package, or other receiver, includes a universal template containing holes at locations in an aggregate pattern of all hole locations for the several different patterns, and includes a subtemplate for each individual different pattern that contains posts at locations for insertion from the rear of the template into holes therein at locations where no surface recess is desired. The universal template may remain aligned with an assembly jig or holder of packages while only the subtemplate is changed to change the surface pattern of holes into which solder balls may then be distributed.

4 Claims, 4 Drawing Sheets

INTEGRATED CIRCUIT PACKAGING APPARATUS AND METHOD

FIELD OF THE INVENTION

This invention relates to solder bump packaging apparatus for integrated circuits, and more particularly to apparatus and method for manipulating templates to present or deliver an array of solder balls to a connector board for an integrated circuit.

BACKGROUND OF THE INVENTION

Complex integrated circuits are commonly attached and wired to connector boards that contain peripheral patterns of connector pads for solder connection to associated circuitry at connection sites that are disposed in common connection patterns. Substantially simultaneous soldering of all connector pads can be accomplished by positioning a miniature solder ball of about 0.030" diameter dimension on each pad for subsequent wetting and solder attachment to an associated connection site. Where several hundred such connector pads are involved, delivering solder balls to each connector pad is laborious and fraught with potential for defects at connector pads to which solder balls were not delivered.

A master template having surface recesses disposed in a pattern corresponding to the pattern of connector pads on the connector board is commonly used to assemble a plurality of solder balls for simultaneous delivery onto the connector pads. These master templates with associated surface recesses are known to 'sift' a plurality of solder balls into the surface recesses for subsequent transfer or delivery to the connector pads. However, where multiple types of integrated circuit types are to be packaged, each having different peripheral patterns of connector pads on the associated connector board, substantial expense is incurred to prepare such a master template for each pattern in which solder balls are to be delivered. In addition, an inventory of master templates must be maintained for reconfiguring automated fabrication equipment with a selected master template corresponding to the pattern of connector pads associated with a selected type of integrated circuit. Machine down time during reconfiguration and re-aligning of master templates with jigs for holding the different types of connector boards all contribute to lost production and associated expenses.

SUMMARY OF THE INVENTION

In accordance with the present invention, a universal template is used that includes a maximum number of surface recesses disposed in a superset pattern of all possible subset patterns required to accommodate several types of integrated circuits. The selected subsets of recesses in the universal template are then prepared via a back plate that contains posts disposed thereon to protrude into the rear of the surface recesses in the universal template to fill unwanted surface recesses, and that also provides backing for desired surface recessed. In this way, the universal template can remain in aligned position with the associated holder of connector boards, while the desired pattern of surface recesses is completed by inserting a backing plate carrying posts that protrude into the undesired surface recesses from the rear thereof. Thus, the master template is formed with a universal set of holes in a face plate, and with a backing plate attached to the rear of the face plate to stop on bottom selected holes that form the desired surface recesses. The backing plate includes posts disposed thereon to protrude into and fill undesired holes in the universal set to thereby eliminate surface recesses where undesired. Solder balls thereafter sifted into the remaining bottomed holes in the universal template may thereafter be delivered in the desired pattern to the connector pads arranged in the corresponding pattern.

BRIEF DESCRIPTION OF THE INVENTION

DETAILED DESCRIPTION OF THE INVENTION

Figure 1:
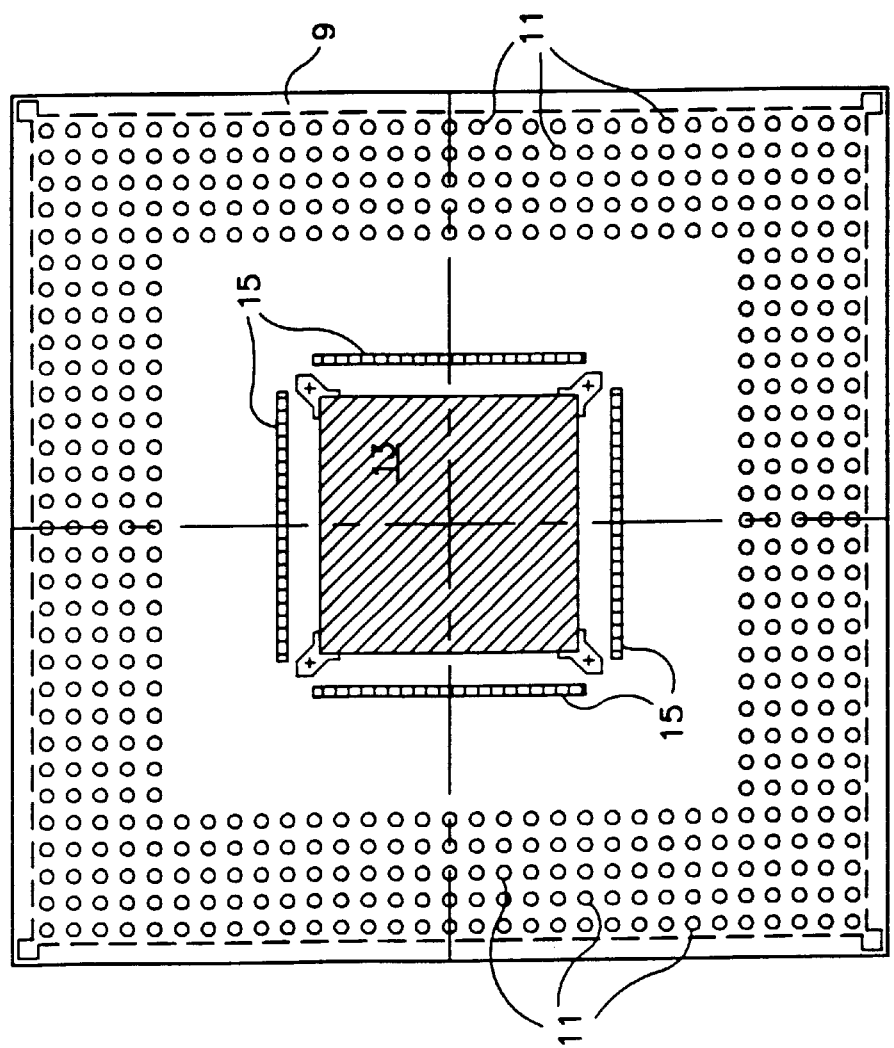
FIG. 1 is a plan view of a typical connector board for an integrated circuit.

Referring now to FIG. 1, there is shown a typical connector board 9 including a plurality of connector pads 11 disposed about the periphery of the board 9 to surround a central region 13 in which an integrated circuit chip of selected type is to be located. A selected subset containing less than all of the maximum-available connector pads 11 may be desired for a particular type of integrated circuit that is to be attached to the connector board in central region 13, and that is to be wire-bond connected in conventional manner from such integrated circuit to individual bonding leads 15 adjacent the central attachment region 13. These bonding leads 15 are individually connected to corresponding connector pads 11, for example, via conventions printed circuit board fabrication techniques, to provide more widely spaced connector pads 11 for connections to external circuitry by convenient automated soldering techniques following wirebonding between bonding leads 15 and the integrated circuit. One such subset of the maximum number of connector pads 11 may include one less connector pad 11, for example, where omitted as illustrated in the lower left corner of FIG. 1. Alternatively, an entire or partial inner line of connector pads 11 may be deleted, and each such subset may vary in relation to the type of integrated circuit to be attached and wired to the connector board 9 near the central region 13.

Figure 2:
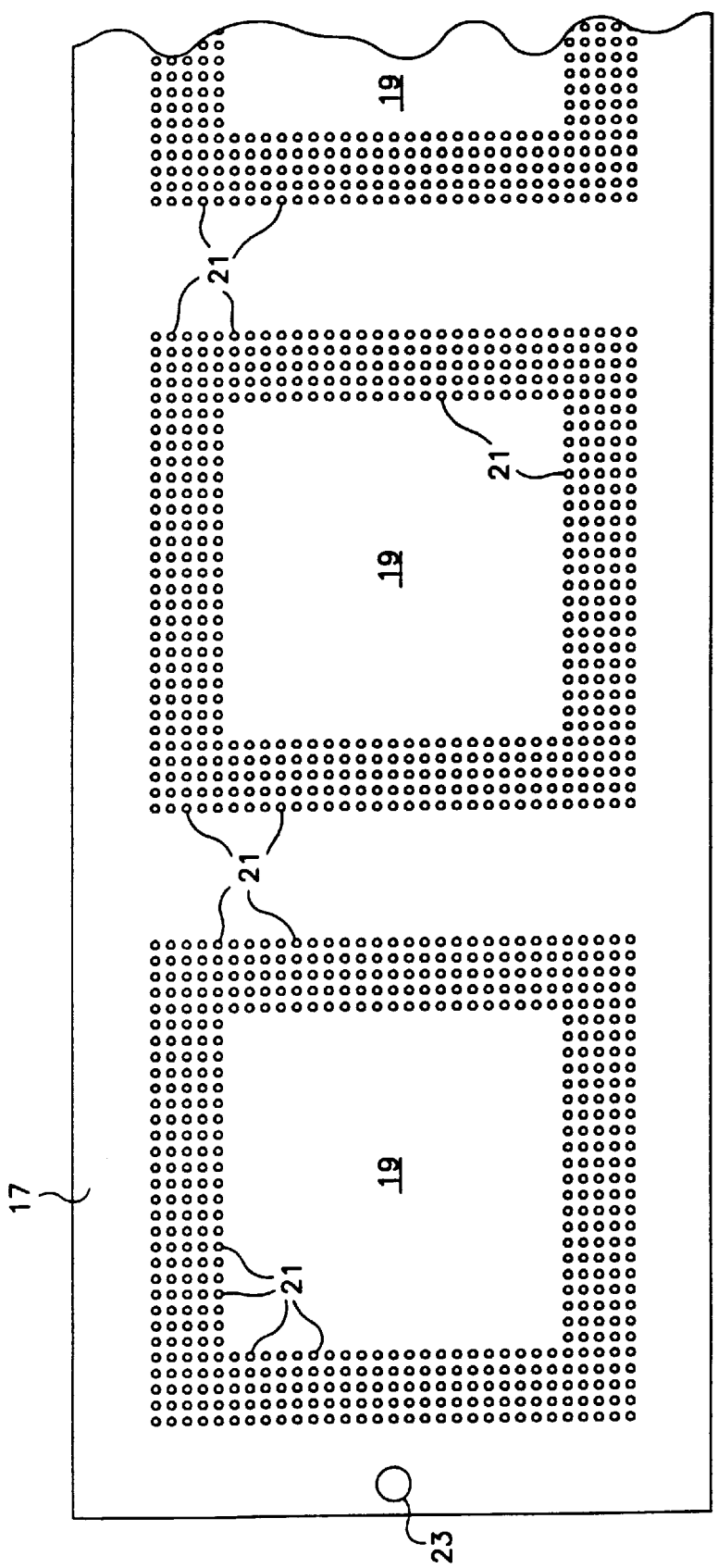
FIG. 2 is a plan view of a universal template according to the present invention.
Figure 3:
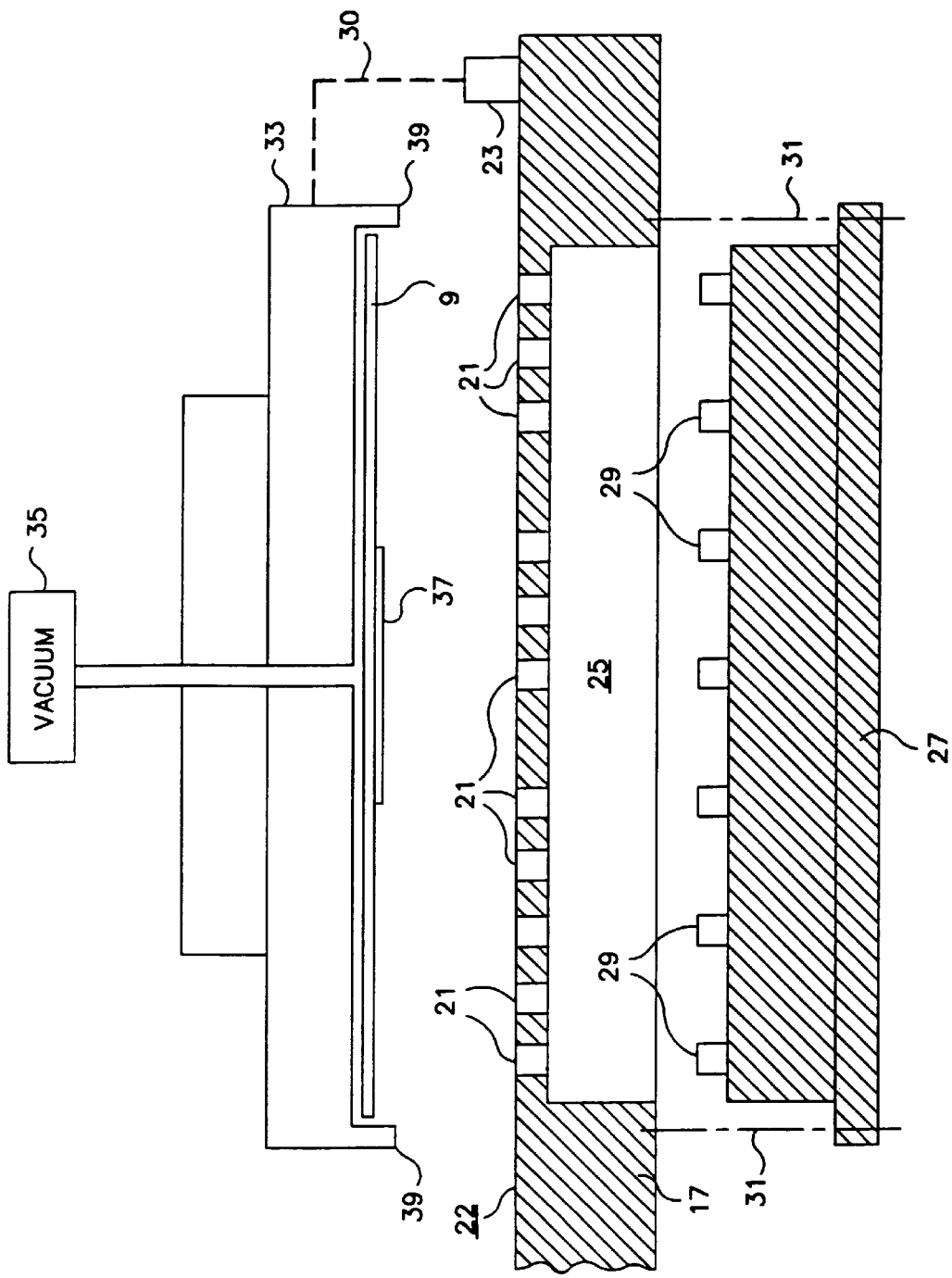
FIG. 3 is an exploded sectional view of a face plate and backing plate for assembly into a template containing a selected subset of surface recesses for retaining and delivering solder balls to connector pads in the selected subset pattern.

Referring now to FIG. 2, there is shown a partial plan view of a universal template 17 having plural patterns 19 of sets of holes 21 disposed in peripheral superset arrays corresponding to positions of connector pads 11 on corresponding connector boards 9. The holes are approximately 0.032" diameter on approximately 0.050" center-to-center spacing along coordinate axes. Of course, the holes 21 may be oriented in other convenient superset patterns including diamond arrays, substantially round arrays, and the like. The holes 21 penetrate a portion of the template 17 that may be approximately 0.025" thick where relieved from the back side of the template, as illustrated in FIG. 3, in order to provide surface recesses in the face of the template 17 that are stopped, or bottomed, from the back side at a depth of about 0.025". The template 17 may include registration pins 23 and other conventional alignment apparatus for assuring proper registration of the holes 21 with connector pads 11 on connector boards 9 that are suitably secured into conventional package holder (not shown in FIG. 2) during selected phases of automated fabrication processes.

Referring now to the partial, exploded sectional view of FIG. 3, there is shown the template 17 with a plurality of holes 21 shown penetrating from the face 22 through to a relieved region 25 of reduced thickness behind face 22. With a reduced thickness of the template 17 in the relieved region 25 of about 0.025", the holes 21 form surface recesses in the face 22 of about the same depth. Backing plate 27 is inserted into the region 25 of reduced thickness to stop or bottom the holes 21 at a depth about equal to the thickness in region 25. Backing plate 27 also carries posts 29 that are aligned to penetrate selected holes 21 to about the thickness in the reduced section 25. Thus, selected holes 21 are filled by posts 29 to eliminate surface recesses at such locations. Alternatively, the backing plate 27 may carry posts of two length dimensions so that, instead of reducing the thickness of the template 17 in the region 25, posts of longer length fully penetrate and fill undesirable holes while posts of shorter length penetrate desired holes to within about 0.025" recess from the surface 22. Therefore, solder balls of about 0.030" diameter can be sifted into holes 21 that are not fully filled by penetrating posts 29 and that are stopped or bottomed by the backing plate 27. The backing plate 27 may be rigidly attached to the template 17 via bolts 31, or other suitable fastenings to provide a finished template or so-called 'presenter' plate for establishing the selected subset pattern in which solder balls will be assembled for presentation or delivery to the mating pattern of connector pads 11 of a connector board 9.

Figure 4:
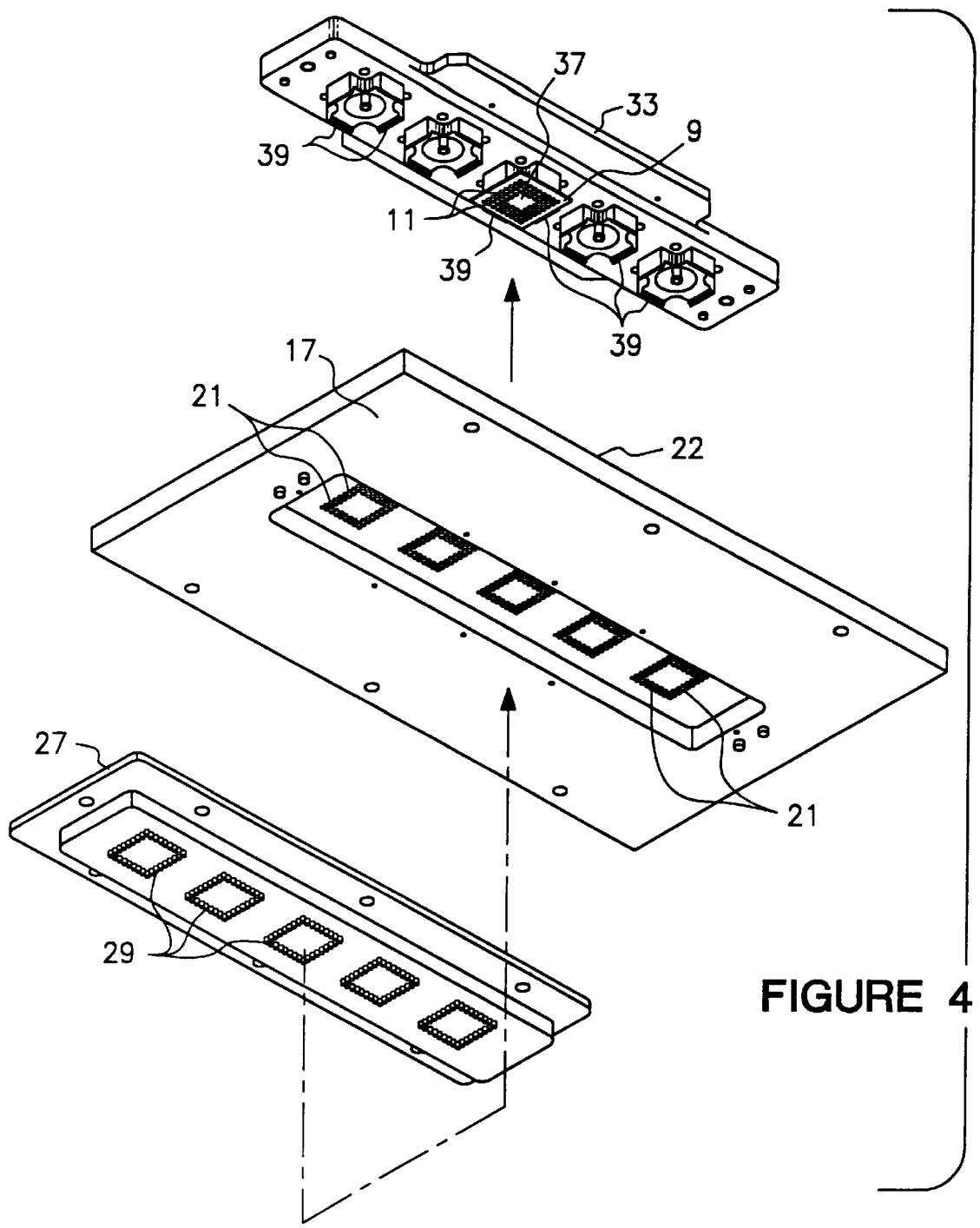
FIG. 4 is an exploded perspective view of the solder ball template in operative relationship to an integrated circuit package.

In operation, setup time for automated assembly equipment is greatly reduced by retaining alignment apparatus 30 including registration pin 23 on the universal template 17 oriented with respect to a holder or jig 33 for the connector board 9. Then, only the backing plate 27 with penetrating post 29 need be replaced, as illustrated in the exploded perspective view of FIG. 4, to establish a different pattern of surface recesses in which solder balls will be assembled for delivery to a matching connector board 9. A vacuum source 35 may be coupled to the holder or jig 33 in order to retain a package of connector board 9 and a centrally-attached integrated circuit chip 37 in close registration or alignment with the holes 21 in template 17 as both components are tilted or rotated into operational orientations. Specifically, plural solder balls (not shown) having about 0.030" diameter are disposed on the surface 22 of the template 17 which may be tilted from side to side and/or from end to end sufficiently frequently to assure that all remaining surface recesses formed by holes 21 (not filled by posts 29) are filled with one solder ball in each hole. No solder balls collect in holes 21 that are penetrated by posts 29 carried by the attached backing plate 27, and excess solder balls are then removed from the surface 22 and patterns of holes 21 in the template 17, for example, by tilting the template 17 to allow excess solder balls to roll away into a remote reservoir. The template 17, with the available holes 21 in surface 22 now completely filled with solder balls, can be brought into close proximity with the surface of connector board 9 having the mating pattern thereon of connector pads 11. The surface of the connector board 9 may be coated in conventional manner with a thin layer of viscous soldering flux, and may be spaced a small distance (e.g., less than a diameter of the solder balls) away from the surface 22 of the template 17, for example, by the dimensions of the shoulders 39 that protrude toward the surface 22 of the template 17. The template 17 and holder 33 may then be rotated toward a position of inverted orientation to assure that the solder balls drop from the template 17 onto the connector pads 11 on connector board 9 where the layer of viscous soldering flux on the surfaces of the connector pads 11 retains the solder balls in position. Thereafter, the solder balls may be melted in situ on the connector pads 11 one or more times within conventional reflow soldering furnaces to connect the integrated circuit 37 and associated connector board 9 to external circuitry.

Therefore, the apparatus and method of assembling solder balls for delivery to a connector board greatly facilitates mechanical alignment and reduces set-up time in automated assembly equipment by using individualized backing plates with one universal template to accommodate an entire family of integrated circuit types which have different patterns of connector pads for solder connection to external circuitry.

What is claimed is:

1. A method for assembling solder balls in a selected one of a plurality of patterns of solder balls within a template for delivery to a receiver, comprising the steps of:

forming the template including a plurality of surface recesses in a selected pattern including surface recesses at aggregate locations of surface recesses of said plurality of patterns, each recess descending a selected depth from the surface of the template to an opening remote from the surface;

removably obscuring selected ones of the surface recesses in the selected pattern through the openings thereof to form a pattern of surface recesses different from the selected pattern for assembling solder balls within remaining ones of the plurality of surface recesses that are not obscured.

2. The method of claim 1 including the step of:

retaining the selected pattern of surface recesses in position of alignment with respect to the receiver; and selectively obscuring selected ones of the surface recesses in the selected pattern thereof for forming different patterns of surface recesses without altering the alignment thereof with the receiver.

3. The method according to claim 2 wherein:

the selected ones of the surface recesses are selectively obscured from a location remote from the surface in which the recess is disposed.

4. The method according to claim 3 comprising:

forming a subtemplate including a plurality of posts disposed thereon in substantially parallel orientation at locations at which said selector surface recesses are to be obscured, the selected pattern of software recesses includes a plurality of holes in substantially parallel orientation relative to the surface in which the holes as surface recesses are formed; and removably inserted the plurality of post on the subtemplate into the selected ones of the holes in the pattern substantially to the surface to obscure the selected holes as surface recesses.

* * * * *